(12) United States Patent
McGraw et al.

(10) Patent No.: US 10,654,272 B2
(45) Date of Patent: May 19, 2020

(54) VALVED MICRONOZZLE ARRAY FOR HIGH TEMPERATURE MEMS APPLICATION

(71) Applicant: Universal Display Corporation, Ewing, NJ (US)

(72) Inventors: Gregory McGraw, Yardley, PA (US); Matthew King, Evesham, NJ (US); William E. Quinn, Whitehouse Station, NJ (US)

(73) Assignee: Universal Display Corporation, Ewing, NJ (US)

( * ) Notice: Subject to any disclaimer, the term of this patent is extended or adjusted under 35 U.S.C. 154(b) by 0 days.

(21) Appl. No.: 16/243,393

(22) Filed: Jan. 9, 2019

(65) Prior Publication Data
US 2019/0217610 A1    Jul. 18, 2019

Related U.S. Application Data

(60) Provisional application No. 62/616,557, filed on Jan. 12, 2018.

(51) Int. Cl.
*B41J 2/14* (2006.01)
*B41J 2/16* (2006.01)
(Continued)

(52) U.S. Cl.
CPC ........... *B41J 2/1433* (2013.01); *B05B 1/1609* (2013.01); *B41J 2/14* (2013.01); *B41J 2/16* (2013.01);
(Continued)

(58) Field of Classification Search
CPC . B41J 2/14; B41J 2/16; H01L 51/0005; H01L 51/56; H01L 51/0004
(Continued)

(56) References Cited

U.S. PATENT DOCUMENTS

| 4,769,292 A | 9/1988 | Tang |
| 5,247,190 A | 9/1993 | Friend |

(Continued)

FOREIGN PATENT DOCUMENTS

| WO | 2008057394 A1 | 5/2008 |
| WO | 2010011390 A2 | 1/2010 |

OTHER PUBLICATIONS

Baldo et al.Highly efficient phosphorescent emission from organic electroluminescent devices, Nature, vol. 395, pp. 151-154, 1998.

(Continued)

*Primary Examiner* — An H Do
(74) *Attorney, Agent, or Firm* — Morris & Kamlay LLP

(57) ABSTRACT

Embodiments of the disclosed subject matter provide a micronozzle array formed from monolithic silicon. The micronozzle array may have a plurality of nozzles, where each nozzle of the plurality of nozzles including an integrated plug valve that allows flow from the nozzle to be attenuated separately from each other nozzle of the plurality of nozzles. Each of the plurality of nozzles may include a microchannel, formed from the monolithic silicon, having a first channel portion and a second channel portion, where the first channel portion is narrower than the second channel portion, and where the first channel portion forms an aperture of the nozzle that is configured to eject vapor from the microchannel. Each of the plurality of nozzles may include a stem, formed from the monolithic silicon that includes the integrated plug valve is suspended in the microchannel to attenuate the flow from the nozzle.

18 Claims, 11 Drawing Sheets

(51) Int. Cl.
*H01L 51/00* (2006.01)
*B05B 1/16* (2006.01)
*H01L 51/56* (2006.01)

(52) U.S. Cl.
CPC ............ *B41J 2/162* (2013.01); *B41J 2/1623* (2013.01); *B41J 2/1628* (2013.01); *H01L 51/0005* (2013.01); *B41J 2202/05* (2013.01); *H01L 51/0004* (2013.01); *H01L 51/56* (2013.01)

(58) Field of Classification Search
USPC ............................................ 347/63, 65, 109
See application file for complete search history.

(56) References Cited

U.S. PATENT DOCUMENTS

| | | | |
|---|---|---|---|
| 5,703,436 A | 12/1997 | Forrest | |
| 5,707,745 A | 1/1998 | Forrest | |
| 5,834,893 A | 11/1998 | Bulovic | |
| 5,844,363 A | 12/1998 | Gu | |
| 6,013,982 A | 1/2000 | Thompson | |
| 6,087,196 A | 7/2000 | Sturm | |
| 6,091,195 A | 7/2000 | Forrest | |
| 6,097,147 A | 8/2000 | Baldo | |
| 6,294,398 B1 | 9/2001 | Kim | |
| 6,303,238 B1 | 10/2001 | Thompson | |
| 6,337,102 B1 | 1/2002 | Forrest | |
| 6,468,819 B1 | 10/2002 | Kim | |
| 7,279,704 B2 | 10/2007 | Walters | |
| 7,431,968 B1 | 10/2008 | Shtein | |
| 7,968,146 B2 | 6/2011 | Wagner | |
| 8,132,744 B2 * | 3/2012 | King | F23D 11/16 239/290 |
| 8,539,905 B2 * | 9/2013 | Cady | B01L 3/0248 118/300 |
| 9,178,184 B2 | 11/2015 | McGraw | |
| 10,029,416 B2 * | 7/2018 | Johnson | B29C 64/20 |
| 2003/0230980 A1 | 12/2003 | Forrest | |
| 2004/0174116 A1 | 9/2004 | Lu | |
| 2015/0376787 A1 | 12/2015 | McGraw | |
| 2015/0380648 A1 | 12/2015 | McGraw | |
| 2017/0229663 A1 | 8/2017 | Tsai | |

OTHER PUBLICATIONS

Baldo, et al., "Very high-efficiency green organic light-emitting devices based on electrophosphorescence", Applied Physics Letters, Jul. 5, 1999, 4 pp., vol. 75, No. 1, American Institute of Physics, Melville, NY, USA.

K. E. Petersen "Silicon as a Mechanical Material" Proc. IEEE 70 5, 1982.

C. Yun, J. Choi, H. W. Kang, M. Kim, H. Moon, H. H. Sung and S. Yoo Adv. Mater. 2012, 24, 2857-2862.

* cited by examiner

VALVED MICRONOZZLE ARRAY FOR HIGH TEMPERATURE MEMS APPLICATION

CROSS-REFERENCE TO RELATED APPLICATIONS

This application claims priority to U.S. Patent Application Ser. No. 62/616,557, filed Jan. 12, 2018, the entire contents of which are incorporated herein by reference.

FIELD

The present invention relates to a micronozzle array that includes integrated plug valves that allow flow from each nozzle in the array to be individually attenuated, so that discrete segments of OLED emissive materials may be printed.

BACKGROUND

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting diodes/devices (OLEDs), organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

OLEDs make use of thin organic films that emit light when voltage is applied across the device. OLEDs are becoming an increasingly interesting technology for use in applications such as flat panel displays, illumination, and backlighting. Several OLED materials and configurations are described in U.S. Pat. Nos. 5,844,363, 6,303,238, and 5,707,745, which are incorporated herein by reference in their entirety.

One application for phosphorescent emissive molecules is a full color display. Industry standards for such a display call for pixels adapted to emit particular colors, referred to as "saturated" colors. In particular, these standards call for saturated red, green, and blue pixels. Alternatively the OLED can be designed to emit white light. In conventional liquid crystal displays emission from a white backlight is filtered using absorption filters to produce red, green and blue emission. The same technique can also be used with OLEDs. The white OLED can be either a single EML device or a stack structure. Color may be measured using CIE coordinates, which are well known to the art.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule," and it is believed that all dendrimers currently used in the field of OLEDs are small molecules.

As used herein, "top" means furthest away from the substrate, while "bottom" means closest to the substrate. Where a first layer is described as "disposed over" a second layer, the first layer is disposed further away from substrate. There may be other layers between the first and second layer, unless it is specified that the first layer is "in contact with" the second layer. For example, a cathode may be described as "disposed over" an anode, even though there are various organic layers in between.

As used herein, "solution processible" means capable of being dissolved, dispersed, or transported in and/or deposited from a liquid medium, either in solution or suspension form.

A ligand may be referred to as "photoactive" when it is believed that the ligand directly contributes to the photoactive properties of an emissive material. A ligand may be referred to as "ancillary" when it is believed that the ligand does not contribute to the photoactive properties of an emissive material, although an ancillary ligand may alter the properties of a photoactive ligand.

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) are measured as a negative energy relative to a vacuum level, a higher HOMO energy level corresponds to an IP having a smaller absolute value (an IP that is less negative). Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher" HOMO or LUMO energy level appears closer to the top of such a diagram than a "lower" HOMO or LUMO energy level.

As used herein, and as would be generally understood by one skilled in the art, a first work function is "greater than" or "higher than" a second work function if the first work function has a higher absolute value. Because work functions are generally measured as negative numbers relative to vacuum level, this means that a "higher" work function is more negative. On a conventional energy level diagram, with the vacuum level at the top, a "higher" work function is illustrated as further away from the vacuum level in the downward direction. Thus, the definitions of HOMO and LUMO energy levels follow a different convention than work functions.

More details on OLEDs, and the definitions described above, can be found in U.S. Pat. No. 7,279,704, which is incorporated herein by reference in its entirety.

SUMMARY

According to an embodiment, an organic light emitting diode/device (OLED) is also provided. The OLED can include an anode, a cathode, and an organic layer, disposed between the anode and the cathode. According to an embodiment, the organic light emitting device is incorporated into one or more device selected from a consumer product, an electronic component module, and/or a lighting panel.

According to an embodiment, a micronozzle array may be formed from monolithic silicon and configured for use at 200-400° C. The micronozzle array may have a plurality of nozzles, where each nozzle of the plurality of nozzles includes an integrated plug valve that allows flow from the nozzle to be attenuated separately from each other nozzle of the plurality of nozzles. Each of the plurality of nozzles may include a microchannel, formed from the monolithic silicon, having a first channel portion and a second channel portion, where the first channel portion is narrower than the second channel portion, and where the first channel portion forms an aperture of the nozzle that is configured to eject vapor from the microchannel. The second channel portion of the microchannel of the device may include a via. Each of the plurality of nozzles may include a stem, formed from the monolithic silicon that includes the integrated plug valve is suspended in the microchannel to attenuate the flow from the nozzle.

The microchannel may include a taper, and a plug of the integrated plug valve may block the flow of the nozzle aperture when it abuts the taper. The taper may be a valve seat of the integrated plug valve. The plug connected to the stem may be suspended by a plurality of spring elements formed from the monolithic silicon and connected to sidewalls of the second channel portion of the microchannel. The stem may be formed with a push rod from the monolithic silicon, where the plug, stem, and push rod extend through the depth of the microchannel, and the push rod extends beyond an upper plane of the micronozzle array. The push rod may be actuated by one of a piezoelectric cell and a ceramic block, a camshaft, and/or a solenoid. The push rod may be one of a plurality of push rods of the micronozzle array, where each push rod of the plurality of push rods actuates a valve of the microchannel array individually. The push rod may be one of a plurality of push rods of the micronozzle array, where each push rod of the plurality of push rods are actuated by a single actuator. A flow path along the push rod may be linked to exhaust flow to prevent organic vapor from leaking to an upper surface of the micronozzle array. The stem may have a first section and a second section, where the first section is narrower than the second section downstream of a via, and the second section is wider than the first section upstream of the via.

The device may include a first seat formed to a first sidewall of the microchannel from the monolithic silicon, and a second seat formed to a second sidewall of the microchannel from the monolithic silicon, where the first seat and the second seat prevent downstream movement of the plug so that a delivery portion of the microchannel is clear. The device may include a plurality of delivery apertures, where the microchannel is formed from the monolithic silicon so as to be connected to one of the plurality of delivery apertures of the micronozzle array, and other microchannels of the plurality of microchannels are formed from the monolithic silicon so as to be respectively connected to the other delivery apertures of the plurality of delivery apertures. The device may include a first exhaust channel formed from the monolithic silicon and disposed adjacent to a first side of the microchannel, and a second exhaust channel formed from the monolithic silicon and disposed adjacent to a second side of the microchannel. The first exhaust channel may include a first exhaust via, and the second exhaust channel may include a second exhaust via. The device may include a first exhaust aperture disposed at a lower edge of the first exhaust channel, and a second exhaust aperture disposed at a lower edge of the second exhaust channel. The device may include a first shunt formed from the monolithic silicon and disposed between a delivery gas inlet channel of the microchannel and the first exhaust channel, and a second shunt formed from the monolithic silicon and disposed between a delivery gas inlet channel of the microchannel and the second exhaust channel.

The micronozzle array of the device may be held onto a print head by a pressure plate or may be bonded directly to the print head.

DETAILED DESCRIPTION

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

The initial OLEDs used emissive molecules that emitted light from their singlet states ("fluorescence") as disclosed, for example, in U.S. Pat. No. 4,769,292, which is incorporated by reference in its entirety. Fluorescent emission generally occurs in a time frame of less than 10 nanoseconds.

More recently, OLEDs having emissive materials that emit light from triplet states ("phosphorescence") have been demonstrated. Baldo et al., "Highly Efficient Phosphorescent Emission from Organic Electroluminescent Devices," Nature, vol. 395, 151-154, 1998; ("Baldo-I") and Baldo et al., "Very high-efficiency green organic light-emitting devices based on electrophosphorescence," Appl. Phys. Lett., vol. 75, No. 3, 4-6 (1999) ("Baldo-II"), are incorporated by reference in their entireties. Phosphorescence is described in more detail in U.S. Pat. No. 7,279,704 at cols. 5-6, which are incorporated by reference.

Figure 1:
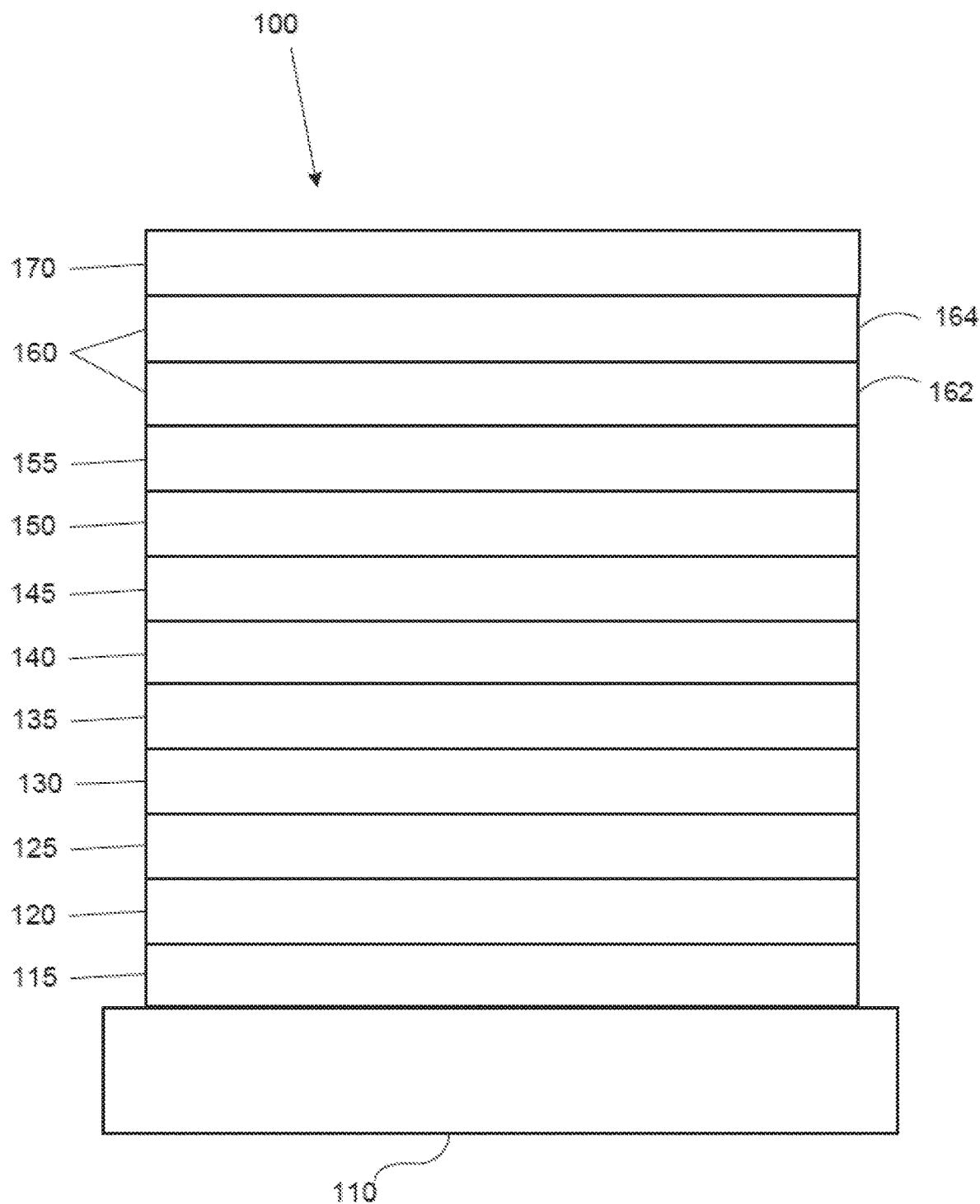
FIG. 1 shows an organic light emitting device.

FIG. 1 shows an organic light emitting device 100. The figures are not necessarily drawn to scale. Device 100 may include a substrate 110, an anode 115, a hole injection layer 120, a hole transport layer 125, an electron blocking layer 130, an emissive layer 135, a hole blocking layer 140, an electron transport layer 145, an electron injection layer 150, a protective layer 155, a cathode 160, and a barrier layer 170. Cathode 160 is a compound cathode having a first conductive layer 162 and a second conductive layer 164. Device 100 may be fabricated by depositing the layers described, in order. The properties and functions of these various layers, as well as example materials, are described in more detail in U.S. Pat. No. 7,279,704 at cols. 6-10, which are incorporated by reference.

More examples for each of these layers are available. For example, a flexible and transparent substrate-anode combination is disclosed in U.S. Pat. No. 5,844,363, which is incorporated by reference in its entirety. An example of a p-doped hole transport layer is m-MTDATA doped with $F_4$-TCNQ at a molar ratio of 50:1, as disclosed in U.S. Patent Application Publication No. 2003/0230980, which is incorporated by reference in its entirety. Examples of emissive and host materials are disclosed in U.S. Pat. No. 6,303,238 to Thompson et al., which is incorporated by reference in its entirety. An example of an n-doped electron transport layer is BPhen doped with Li at a molar ratio of 1:1, as disclosed in U.S. Patent Application Publication No. 2003/0230980, which is incorporated by reference in its entirety. U.S. Pat. Nos. 5,703,436 and 5,707,745, which are incorporated by reference in their entireties, disclose examples of cathodes including compound cathodes having a thin layer of metal such as Mg:Ag with an overlying transparent, electrically-conductive, sputter-deposited ITO layer. The theory and use of blocking layers is described in more detail in U.S. Pat. No. 6,097,147 and U.S. Patent Application Publication No. 2003/0230980, which are incorporated by reference in their entireties. Examples of injection layers are provided in U.S. Patent Application Publication No. 2004/0174116, which is incorporated by reference in its entirety. A description of protective layers may be found in U.S. Patent Application Publication No. 2004/0174116, which is incorporated by reference in its entirety.

Figure 2:
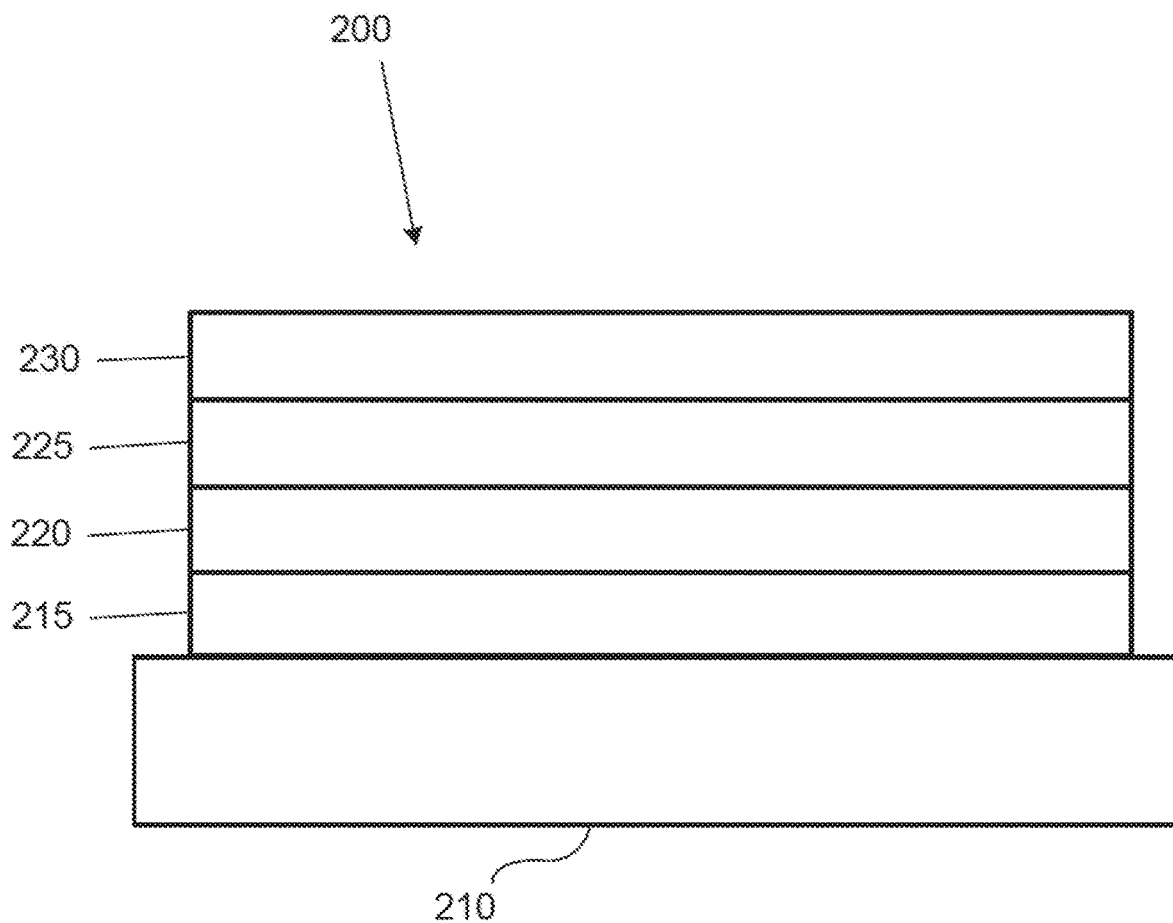
FIG. 2 shows an inverted organic light emitting device that does not have a separate electron transport layer.

FIG. 2 shows an inverted OLED 200. The device includes a substrate 210, a cathode 215, an emissive layer 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 2 provides one example of how some layers may be omitted from the structure of device 100.

The simple layered structure illustrated in FIGS. 1 and 2 is provided by way of non-limiting example, and it is understood that embodiments of the invention may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. For example, in device 200, hole transport layer 225 transports holes and injects holes into emissive layer 220, and may be described as a hole transport layer or a hole injection layer. In one embodiment, an OLED may be described as having an "organic layer" disposed between a cathode and an anode. This organic layer may comprise a single layer, or may further comprise multiple layers of different organic materials as described, for example, with respect to FIGS. 1 and 2.

Structures and materials not specifically described may also be used, such as OLEDs comprised of polymeric materials (PLEDs) such as disclosed in U.S. Pat. No. 5,247,190 to Friend et al., which is incorporated by reference in its entirety. By way of further example, OLEDs having a single organic layer may be used. OLEDs may be stacked, for example as described in U.S. Pat. No. 5,707,745 to Forrest et al, which is incorporated by reference in its entirety. The OLED structure may deviate from the simple layered structure illustrated in FIGS. 1 and 2. For example, the substrate may include an angled reflective surface to improve out-coupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. Pat. No. 7,431,968, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink-jet and OVJD. Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3-20 carbons is a preferred range. Materials with asymmetric structures may have better solution processability than those having symmetric structures, because asymmetric materials may have a lower tendency to recrystallize. Dendrimer substituents may be used to enhance the ability of small molecules to undergo solution processing.

Devices fabricated in accordance with embodiments of the present invention may further optionally comprise a barrier layer. One purpose of the barrier layer is to protect the electrodes and organic layers from damaging exposure to harmful species in the environment including moisture, vapor and/or gases, etc. The barrier layer may be deposited over, under or next to a substrate, an electrode, or over any other parts of a device including an edge. The barrier layer may comprise a single layer, or multiple layers. The barrier layer may be formed by various known chemical vapor deposition techniques and may include compositions having a single phase as well as compositions having multiple phases. Any suitable material or combination of materials may be used for the barrier layer. The barrier layer may incorporate an inorganic or an organic compound or both. The preferred barrier layer comprises a mixture of a polymeric material and a non-polymeric material as described in U.S. Pat. No. 7,968,146, PCT Pat. Application Nos. PCT/US2007/023098 and PCT/US2009/042829, which are herein incorporated by reference in their entireties. To be considered a "mixture", the aforesaid polymeric and non-polymeric materials comprising the barrier layer should be deposited under the same reaction conditions and/or at the same time. The weight ratio of polymeric to non-polymeric material may be in the range of 95:5 to 5:95. The polymeric material and the non-polymeric material may be created from the same precursor material. In one example, the mixture of a polymeric material and a non-polymeric material consists essentially of polymeric silicon and inorganic silicon.

Devices fabricated in accordance with embodiments of the invention can be incorporated into a wide variety of electronic component modules (or units) that can be incorporated into a variety of electronic products or intermediate components. Examples of such electronic products or intermediate components include display screens, lighting devices such as discrete light source devices or lighting panels, etc. that can be utilized by the end-user product manufacturers. Such electronic component modules can optionally include the driving electronics and/or power source(s). Devices fabricated in accordance with embodiments of the invention can be incorporated into a wide variety of consumer products that have one or more of the electronic component modules (or units) incorporated therein. A consumer product comprising an OLED that includes the compound of the present disclosure in the organic layer in the OLED is disclosed. Such consumer products would include any kind of products that include one or more light source(s) and/or one or more of some type of visual displays. Some examples of such consumer products include flat panel displays, computer monitors, medical monitors, televisions, billboards, lights for interior or exterior illumination and/or signaling, heads-up displays, fully or partially transparent displays, flexible displays, laser printers, telephones, mobile phones, tablets, phablets, personal digital assistants (PDAs), wearable devices, laptop computers, digital cameras, camcorders, viewfinders, microdisplays (displays that are less than 2 inches diagonal), 3-D displays, virtual reality or augmented reality displays, vehicles, video walls comprising multiple displays tiled together, theater or stadium screen, and a sign. Various control mechanisms may be used to control devices fabricated in accordance with the present invention, including passive matrix and active matrix. Many of the devices are intended for use in a temperature range comfortable to humans, such as 18 C to 30 C, and more preferably at room temperature (20-25 C), but could be used outside this temperature range, for example, from −40 C to 80 C.

The materials and structures described herein may have applications in devices other than OLEDs. For example, other optoelectronic devices such as organic solar cells and organic photodetectors may employ the materials and structures. More generally, organic devices, such as organic transistors, may employ the materials and structures.

In some embodiments, the OLED has one or more characteristics selected from the group consisting of being flexible, being rollable, being foldable, being stretchable, and being curved. In some embodiments, the OLED is transparent or semi-transparent. In some embodiments, the OLED further comprises a layer comprising carbon nanotubes.

In some embodiments, the OLED further comprises a layer comprising a delayed fluorescent emitter. In some embodiments, the OLED comprises a RGB pixel arrangement or white plus color filter pixel arrangement. In some embodiments, the OLED is a mobile device, a hand held device, or a wearable device. In some embodiments, the OLED is a display panel having less than 10 inch diagonal or 50 square inch area. In some embodiments, the OLED is a display panel having at least 10 inch diagonal or 50 square inch area. In some embodiments, the OLED is a lighting panel.

In some embodiments of the emissive region, the emissive region further comprises a host.

In some embodiments, the compound can be an emissive dopant. In some embodiments, the compound can produce emissions via phosphorescence, fluorescence, thermally activated delayed fluorescence, i.e., TADF (also referred to as E-type delayed fluorescence), triplet-triplet annihilation, or combinations of these processes.

The OLED disclosed herein can be incorporated into one or more of a consumer product, an electronic component module, and a lighting panel. The organic layer can be an emissive layer and the compound can be an emissive dopant in some embodiments, while the compound can be a non-emissive dopant in other embodiments.

The organic layer can also include a host. In some embodiments, two or more hosts are preferred. In some embodiments, the hosts used maybe a) bipolar, b) electron transporting, c) hole transporting or d) wide band gap materials that play little role in charge transport. In some embodiments, the host can include a metal complex. The host can be an inorganic compound.

Combination with Other Materials

The materials described herein as useful for a particular layer in an organic light emitting device may be used in combination with a wide variety of other materials present in the device. For example, emissive dopants disclosed herein may be used in conjunction with a wide variety of hosts, transport layers, blocking layers, injection layers, electrodes and other layers that may be present. The materials described or referred to below are non-limiting examples of materials that may be useful in combination with the compounds disclosed herein, and one of skill in the art can readily consult the literature to identify other materials that may be useful in combination.

Various materials may be used for the various emissive and non-emissive layers and arrangements disclosed herein. Examples of suitable materials are disclosed in U.S. Patent Application Publication No. 2017/0229663, which is incorporated by reference in its entirety.

Conductivity Dopants:

A charge transport layer can be doped with conductivity dopants to substantially alter its density of charge carriers, which will in turn alter its conductivity. The conductivity is increased by generating charge carriers in the matrix material, and depending on the type of dopant, a change in the Fermi level of the semiconductor may also be achieved. Hole-transporting layer can be doped by p-type conductivity dopants and n-type conductivity dopants are used in the electron-transporting layer.

HIL/HTL:

A hole injecting/transporting material to be used in the present invention is not particularly limited, and any compound may be used as long as the compound is typically used as a hole injecting/transporting material.

EBL:

An electron blocking layer (EBL) may be used to reduce the number of electrons and/or excitons that leave the emissive layer. The presence of such a blocking layer in a device may result in substantially higher efficiencies, and or longer lifetime, as compared to a similar device lacking a blocking layer. Also, a blocking layer may be used to confine emission to a desired region of an OLED. In some embodiments, the EBL material has a higher LUMO (closer to the vacuum level) and/or higher triplet energy than the emitter closest to the EBL interface. In some embodiments, the EBL material has a higher LUMO (closer to the vacuum level) and or higher triplet energy than one or more of the hosts closest to the EBL interface. In one aspect, the compound used in EBL contains the same molecule or the same functional groups used as one of the hosts described below.

Host:

The light emitting layer of the organic EL device of the present invention preferably contains at least a metal complex as light emitting material, and may contain a host material using the metal complex as a dopant material. Examples of the host material are not particularly limited, and any metal complexes or organic compounds may be used as long as the triplet energy of the host is larger than that of the dopant. Any host material may be used with any dopant so long as the triplet criteria is satisfied.

HBL:

A hole blocking layer (HBL) may be used to reduce the number of holes and/or excitons that leave the emissive layer. The presence of such a blocking layer in a device may result in substantially higher efficiencies and/or longer lifetime as compared to a similar device lacking a blocking layer. Also, a blocking layer may be used to confine emission to a desired region of an OLED. In some embodiments, the HBL material has a lower HOMO (further from the vacuum level) and or higher triplet energy than the emitter closest to the HBL interface. In some embodiments, the HBL material has a lower HOMO (further from the vacuum level) and or higher triplet energy than one or more of the hosts closest to the HBL interface.

ETL:

An electron transport layer (ETL) may include a material capable of transporting electrons. The electron transport layer may be intrinsic (undoped), or doped. Doping may be used to enhance conductivity. Examples of the ETL material are not particularly limited, and any metal complexes or organic compounds may be used as long as they are typically used to transport electrons.

Charge Generation Layer (CGL)

In tandem or stacked OLEDs, the CGL plays an essential role in the performance, which is composed of an n-doped layer and a p-doped layer for injection of electrons and holes, respectively. Electrons and holes are supplied from the CGL and electrodes. The consumed electrons and holes in the CGL are refilled by the electrons and holes injected from the cathode and anode, respectively; then, the bipolar currents reach a steady state gradually. Typical CGL materials include n and p conductivity dopants used in the transport layers.

Figures 3A, 3B:
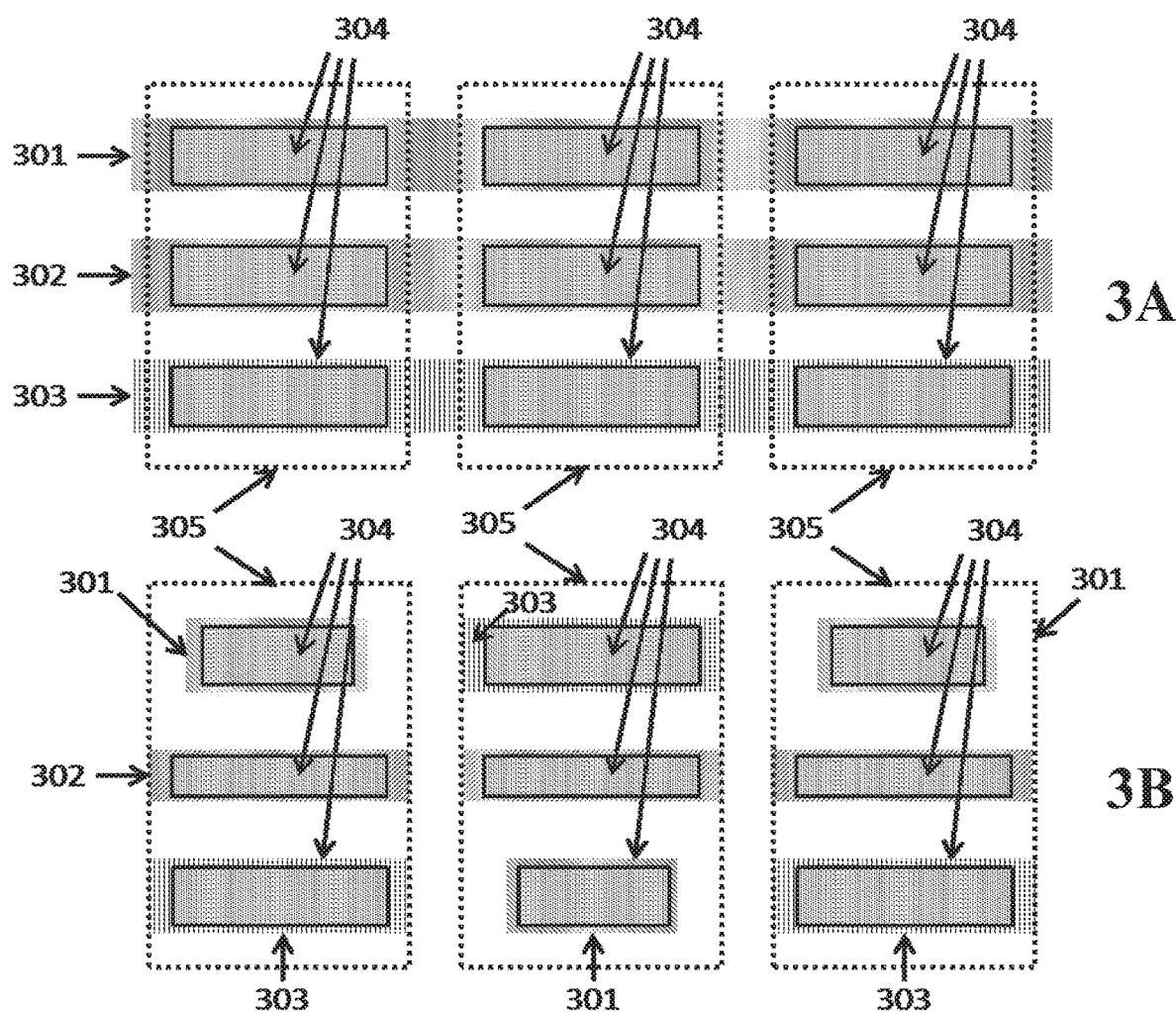
FIGS. 3A-3B show examples of different full color pixel architectures such that subpixels of a given color may be aligned.

Organic Vapor Jet Printing (OVJP) currently prints fine (<200 µm) features as continuous lines rather than sets of discrete points. Full color displays may be fabricated by drawing continuous lines of monochromatic emissive material across an array of aligned pixels, so that each color of emissive material is deposited on the correct subpixel as shown in FIG. 3A. Lines of red 301, green 302, and blue 303 material may be deposited over aligned arrays of subpixel electrodes 304 that comprise each pixel 305. This pixel architecture is desirable for widescreen displays, since it offers high fill factor. Smaller displays, however, may have more complex architectures, like the example shown in FIG. 3B, which is similar to the Samsung PenTile™ display. The emissive material may be distributed in discrete regions, and the positions of the red and blue emitters may be alternated between the top and bottom positions for horizontally adjacent subpixels. This array may not be printed by a continuous process. Both the color and shape of subpixels within a given row may differ from each other. In some display architectures, subpixels may not be arranged in rows. In the embodiments discussed below in connection with FIGS. 4-11D, the utility of OVJP may be improved by shifting deposition on and off on a timescale of interest to print small area OLED displays.

Discrete printing by OVJP has been described by C. Yun et al., *Adv. Mater.*, 24, 2857-2862 (2012). Their process, referred to as Digital OVJP, prints material in pulses controlled by actuating a carrier gas supply valve upstream of the source and/or a relief valve that connects a length of runline between the source and nozzle to vacuum when open. As presented, this process has limitations regarding its suitability for mass production. The system is macroscopic, so both the resolution and cycle times achievable are limited. It prints dots with a diameter greater than 200 µm when overspray is included and its pulse rate is 50 Hz. The embodiments discussed below in connection with FIGS. 4-11D provide devices and methods for valving within a micronozzle array to overcome these limitations.

Deposition from a micronozzle array using Delivery-Exhaust-Confinement (DEC) OVJP technology, as disclosed in, for example, US Patent Publication No. 2015/0376787, the disclosure of which is incorporated by reference in its entirety, may be modulated in time to print discrete segments by adjusting the fly height of the micronozzle array over the substrate. Material in the delivery flow may be captured by the exhaust flow, rather than contacting the substrate when the array is lifted upwards such as described in, for example, US Patent Publication No. 2015/0380648, the disclosure of which is incorporated by reference in its entirety. This method has been demonstrated effective, but modulation frequency may be improved by the embodiments discussed below for printing individual display pixels. In particular, the embodiments discussed below in connection with FIGS. 4-11D may provide modulating printing to increase the functionality of the OVJP process, as well as provide total shutoff of printing.

Organic vapor may typically be heated to temperatures in excess of 550 K to transport properly, so the designs and materials of valves appropriate for OVJP may be limited. Valves in this application may be non-outgassing and made from a thermally resilient material. They may also be very small, operate at high frequency (for example, in the kHz range), possess tight tolerances, and be easy to arrange in large arrays. The embodiments discussed below in connection with FIGS. 4-11D provide a valve integrated into the Si structure of an OVJP micronozzle array, which may be fabricated using the MEMS processing techniques used to make the array.

As shown in FIGS. 4-11D and described in detail below, embodiments of the disclosed subject matter provide a device having a micronozzle array formed from monolithic silicon. The device may be configured for use at 200-400° C. The micronozzle array may have a plurality of nozzles, where each nozzle may include an integrated plug valve that allows flow from the nozzle to be attenuated separately from each other nozzle. The micronozzle array may be held onto a print head by a pressure plate or bonded directly to the print head.

The nozzles of the device may include a microchannel formed from the monolithic silicon that has a first channel portion and a second channel portion. The first channel portion may be narrower than the second channel portion. The first channel portion may form an aperture of the nozzle that may eject vapor from the microchannel. The second channel portion of the microchannel may include a via. The nozzles may include a stem that is formed from the monolithic silicon. The stem may include an integrated plug valve. The stem having the integrated plug valve may be suspended in the microchannel to attenuate the flow from the nozzle.

The microchannel of the nozzles may have a taper. A plug of the integrated plug valve may block the flow of the nozzle aperture when it abuts the taper. In some embodiments, the taper may a valve seat of the integrated plug valve. The stem with the integrated plug may be suspended by spring elements formed from the monolithic silicon and connected to sidewalls of the second channel portion of the microchannel. The stem may have a first section and a second section. The first section may be narrower than the second section downstream of a via, and the second section may be wider than the first section upstream of the via.

The stem may be formed with a push rod from the monolithic silicon. The plug, stem, and push rod may extend through the depth of the microchannel, and the push rod may extend beyond an upper plane of the micronozzle array. The push rod may actuated by a piezoelectric cell and a ceramic block, a camshaft, or a solenoid. There may be a plurality of push rods in the micronozzle array, where each push rod actuates a valve of the microchannel array individually. In some embodiments of the disclose subject matter, each push rod of the plurality of push rods are actuated by a single actuator. A flow path along the push rod may be linked to exhaust flow to prevent organic vapor from leaking to an upper surface of the micronozzle array.

In some embodiments of the disclosed subject matter, a first seat may be formed to a first sidewall of the microchannel from the monolithic silicon, and a second seat may be formed to a second sidewall of the microchannel from the monolithic silicon. The first seat and the second seat may prevent downstream movement of the plug so that a delivery portion of the microchannel is clear.

The device may include a plurality of delivery apertures, where the microchannel may be formed from the monolithic silicon so as to be connected to one of the plurality of delivery apertures of the micronozzle array, and other microchannels may be formed from the monolithic silicon so as to be respectively connected to the other delivery apertures.

The device may include a first exhaust channel formed from the monolithic silicon and disposed adjacent to a first side of the microchannel. A second exhaust channel may be formed from the monolithic silicon and disposed adjacent to a second side of the microchannel. The first exhaust channel may include a first exhaust via, and the second exhaust channel may include a second exhaust via. The device may include a first exhaust aperture disposed at a lower edge of the first exhaust channel, and a second exhaust aperture disposed at a lower edge of the second exhaust channel. The device may include a first shunt that is formed from the monolithic silicon and disposed between a delivery gas inlet channel of the microchannel and the first exhaust channel. A second shunt may be formed from the monolithic silicon and disposed between a delivery gas inlet channel of the microchannel and the second exhaust channel.

Figure 4:
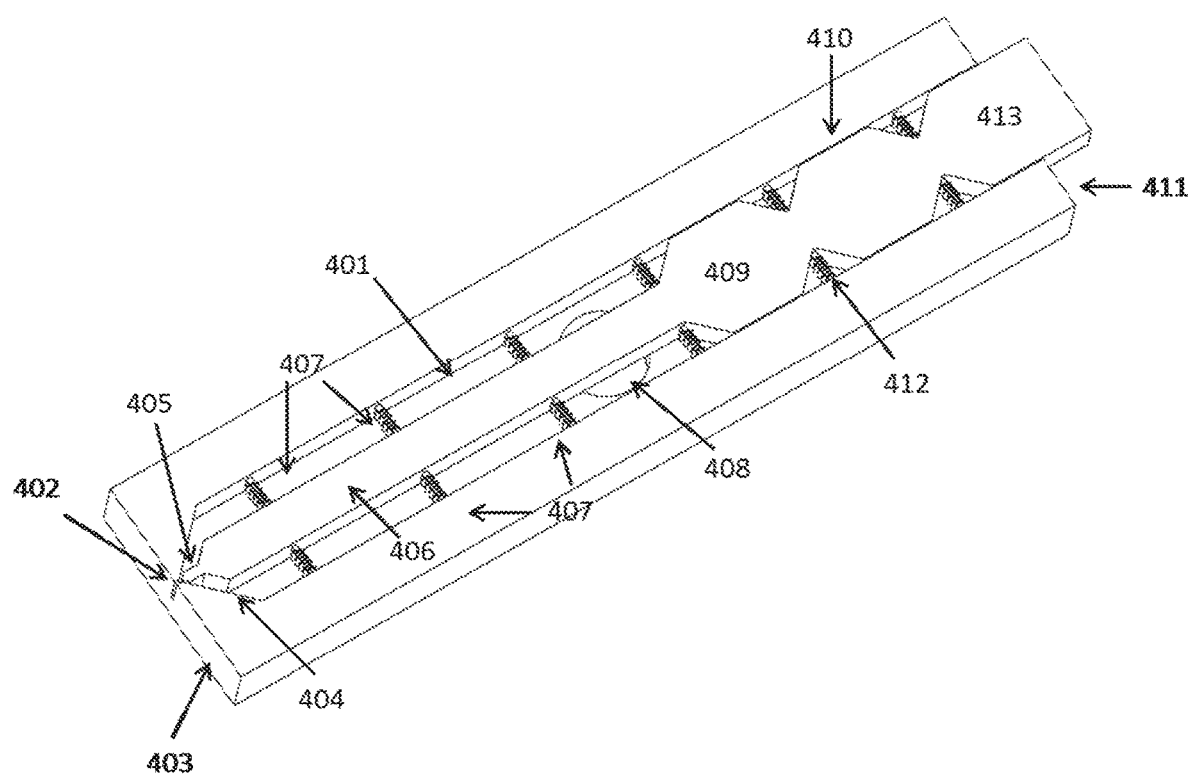
FIG. 4 shows an example of a microchannel terminating in a micronozzle with an integrated plug valve according to an embodiment of the disclosed subject matter.

FIG. 4 shows an example of a microchannel terminating in a micronozzle with an integrated plug valve according to an embodiment of the disclosed subject matter. A microchannel 401 may be formed to a Si micronozzle array as shown in FIG. 4. The downstream portion of the microchannel 401 may terminate in narrower channel 402 that is bisected by the lower plane of the array 403 to form the aperture of a nozzle that ejects vapor from the microchannel 401. The taper 404 between the microchannel 401 and the narrower channel 402 may be complementary to the downstream edge of a plug 405 within the microchannel 401 so that the plug 405 blocks flow to the nozzle aperture (e.g., the narrower channel 402) when it abuts the taper 404. The taper 404 may be a valve seat.

The plug 405 may be connected to a stem 406 that is suspended by spring elements 407 connected to sidewalls of the microchannel 401. The plug 405 and pushrod 413 may extend through the depth of the microchannel 401, with a small clearance between the plug 405 and pushrod 413 and the upper and lower surfaces enclosing the microchannel 401, orthogonal to the planes of the sidewalls. The small clearance may be, for example, less than 5 μm. The spring elements 407 may be shallower structures than the microchannel 401, with 50 μm or more clearance between them and the upper and lower surfaces of the microchannel 401. This may allow vapor to flow freely around the flexures (e.g., the spring elements 407). The stem 409 may have a narrow section 406 downstream of a via 408 from which vapor is introduced. This narrow section 406 of stem 409 may facilitate the low impedance flow of vapor flow through the microchannel 401 to narrower channel 402. The portion of the stem 409 on the opposite side of the via 408 from the nozzle aperture may be widened to increase the flow resistance of vapor along a potential flow path 410 to an upper surface of the array 411. Notches 412 may be cut into the wider portion of the stem 409 to allow spring elements 407 to move freely. The valve stem 409 may terminate in a pushrod 413 that extends beyond a plane of the upper surface of the array 411. Multiple valved channels may be formed and/or mounted in a monolithic Si array.

Figure 5:
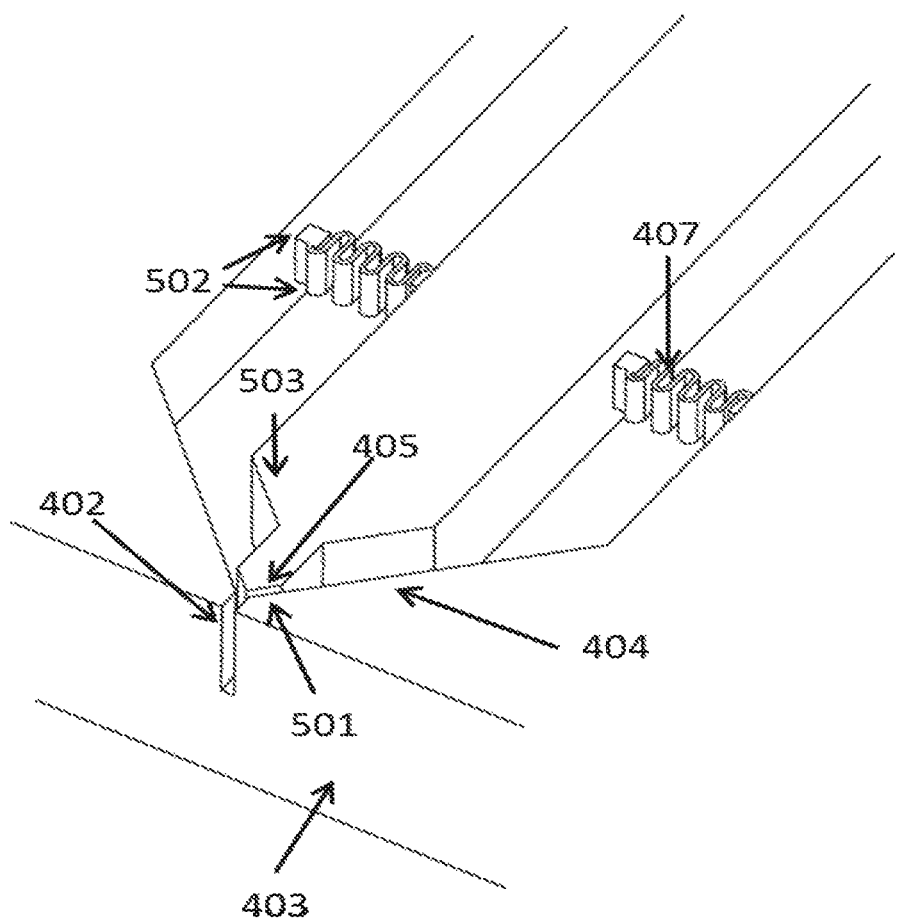
FIG. 5 shows a close-up view of a plug valve within a microchannel of a micronozzle array according to an embodiment of the disclosed subject matter.

FIG. 5 shows a close-up view of a plug valve within a microchannel of a micronozzle array according to an embodiment of the disclosed subject matter. The plug 405 may be positioned approximately 10 μm from its seat at or near an opening of channel 402 when the system is at equilibrium. The plug 405 may normally act as an open valve, and may permit vapor to flow downstream towards the aperture through the gap 501 between the plug 405 and the seat. The bottom surface of the plug 405 may be flush with the seat when the pushrod 413 is depressed, thereby closing the valve. The clearances 502 on the channel sidewalls above and below the spring elements 407 that may allow fluid flow around the flexures are shown in FIG. 5.

The spring elements 407 may be typically 10 μm in thickness, 300 μm in depth, and 300 μm in height. The plug 405 and stem 406, 409 may be 600 μm in height. The aperture of the channel 402 may be an equal or lesser height than that of the pushrod 413 so that it is completely occluded when the plug 405 is in its down position (e.g., at or near the seat). The microchannel 401 may be slightly higher than the plug 405 and the stem, 406, 409 to permit movement. The width of the downstream surface of the plug 405 (e.g., the surface towards channel 402) may be to limit flow restriction by the valve in the open position (e.g., when the plug 405 is positioned at or near the seat). The connection between the plug 405 and the stem 503 may be tapered.

Figure 6B:
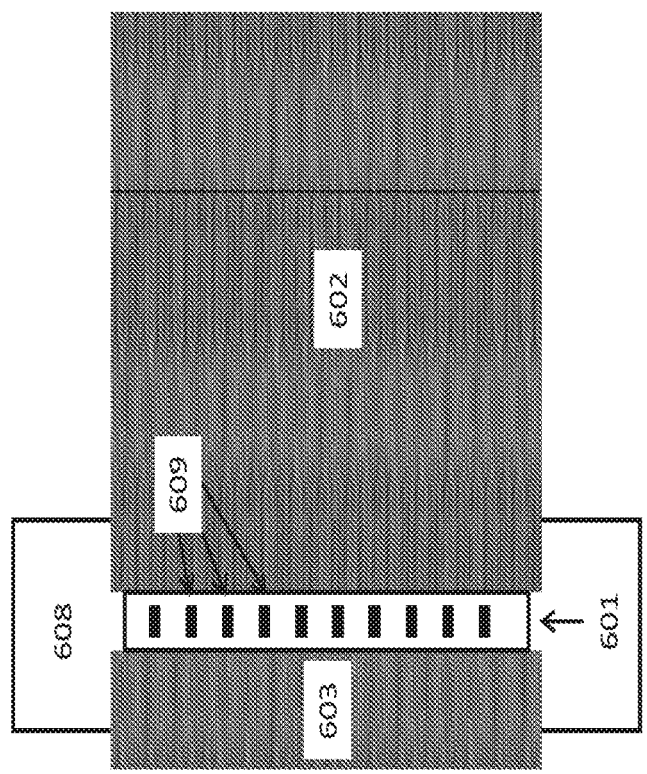
FIGS. 6A-6B show an Organic Vapor Jet Printing (OVJP) print head that includes a micronozzle array with plug valves according to embodiments of the disclosed subject matter.
Figure 6A:
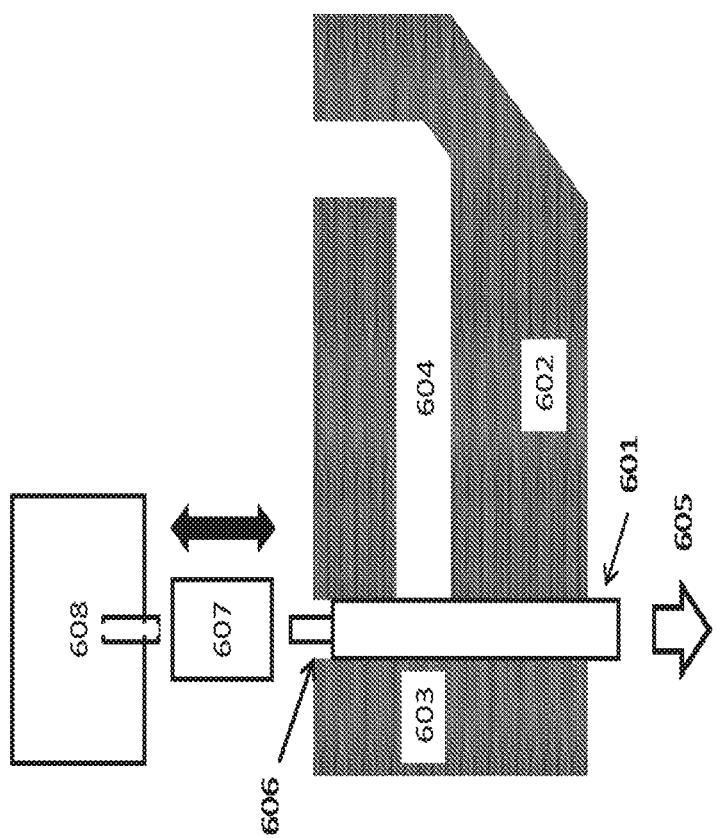

FIGS. 6A-6B show an OVJP print head that includes a micronozzle array with plug valves according to embodiments of the disclosed subject matter. A valved microchannel array may be contained within a print head that supplies it with vapor. The valved microchannel array may include actuators to coordinate valve action.

FIG. 6A shows a cross section of the print head. The micronozzle array 601 may be held onto the print head 602 by a pressure plate 603. Alternatively, the micronozzle 601 may be bonded directly to the print head 602. Carrier gas laden with organic vapor may flow through a channel 604 in the print head 602, and may enter the microchannel array through its vias. The micronozzles may form jets 605 along the lower surface of the micronozzle array 601.

The pushrods 606 associated with each microchannel may be actuated by a variety of mechanisms. For example, as shown in FIG. 6A, a ceramic block 607 may be disposed over the pushrod 606, and may be free to move co-linearly with it. The ceramic block 607 may, in turn, be actuated by a piezoelectric cell 608 that is thermally isolated from the print head 602 by the ceramic block 607. Other possible mechanisms may include camshafts, solenoids, and the like.

The underside of the print head 602, as seen from a substrate, is shown in FIG. 6B, and illustrates the side-by-side arrangement of multiple delivery apertures 609, each connected to separate microchannel within a micronozzle array 601. Each microchannel may have its own pushrod (e.g., pushrod 606), so valves may be actuated individually. Individual actuation may be achieved using an array of piezoelectric elements similar to that found in a Braille display. Alternatively, the microchannels may be grouped into banks with a single actuator. Integrated plug valves may be added to a micronozzle array designed for DEC OVJP. The flow paths (e.g., the flow path 410 shown in FIG. 4) along pushrods (e.g., pushrod 606 shown in FIG. 6A and/or pushrod 413 shown in FIG. 4) may be linked to exhaust flow to minimize and/or prevent organic vapor from leaking to the upper surface of the micronozzle array 601.

Figure 7:
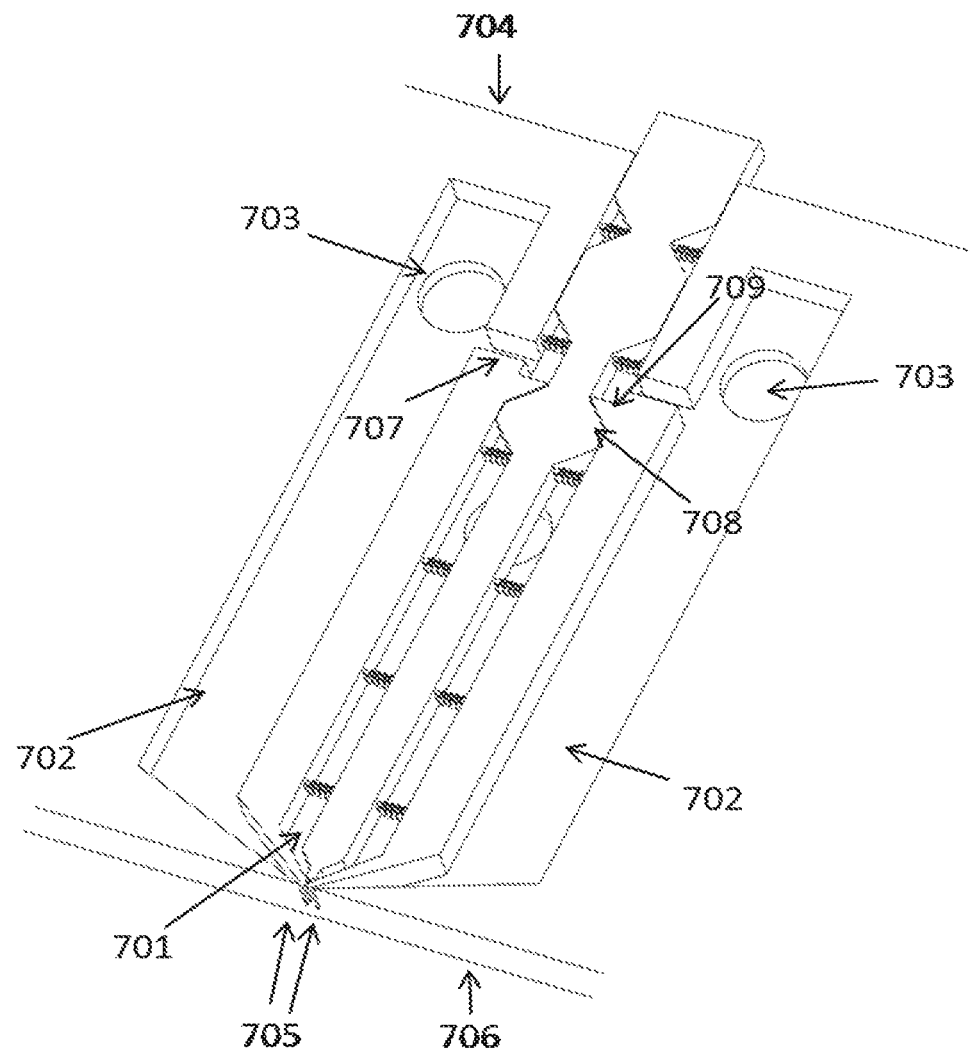
FIG. 7 shows an example of a micronozzle used in DEC (Delivery-Exhaust-Confinement) OVJP that includes an integrated plug valve according to an embodiment of the disclosed subject matter.

FIG. 7 shows an example of a micronozzle used in DEC OVJP that includes an integrated plug valve according to an embodiment of the disclosed subject matter. In particular, FIG. 7 shows a DEC depositor may include the above-described valved microchannel as its delivery channel 701. The delivery channel 701 may be flanked on each side by exhaust channels 702 that extend from exhaust vias 703 near the upper edge 704 to exhaust apertures 705 at the lower edge 706 of the array. The plug need not seal the delivery aperture fully, since the exhaust stream may capture organic vapor that may leak out of a mostly occluded delivery aperture.

A shunt between the delivery and exhaust channels 707 may prevent delivery flow from leaking out of the delivery channel 701 along the path of the pushrod. This shunt path may draw minimal flow when the valve is opened because the conductance through the delivery aperture 701 is much greater. The flow path through the exhaust shunt may be designed so flow through it when the valve is closed is equal to the flow to delivery aperture when the valve is open. Printing may be turned on and off without perturbing source operation. A secondary plug 708 may be added to the stem and a secondary seat 709 may be added to the channel wall between the delivery via and the pushrod.

The valve may be fabricated so that the plugs on the stem may not be fully seated when the stem is in its equilibrium position. The pushrod, the delivery channel 701, and/or the exhaust channels 702 may be etched from the same piece of silicon, so etched trenches separate them so that the stem is free to move. The trench may have a finite width, usually at least 1/30 of the channel depth (e.g., depth of the delivery channel 701). The pressure difference between the delivery via and the exhaust channels 702 may be generally greater than between the delivery via and the delivery aperture. The valve may flow more delivery gas to the exhaust shunt than to the delivery aperture in its equilibrium position. This may be overcome by applying tension to the pushrod so that the plug between the delivery via and exhaust shunt may be fully seated while the flow path between the delivery via and aperture is fully open.

Figure 8:
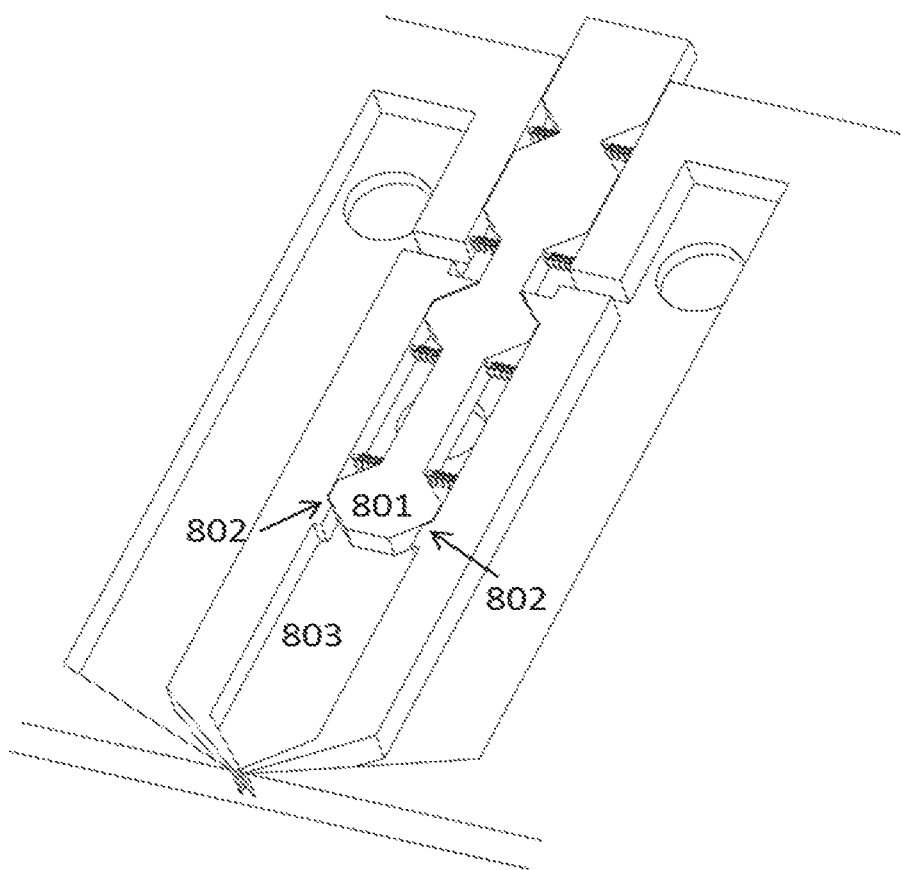
FIG. 8 shows a configuration of a DEC depositor with an integrated valve in which a plug and a seat are located upstream of the delivery aperture according to an embodiment of the disclosed subject matter.

FIG. 8 shows a configuration of a DEC depositor with integrated valve in which the plug and seat are located upstream of the delivery aperture according to an embodiment of the disclosed subject matter. Although the plug valve and seat modulating flow through the delivery nozzle aperture may be positioned adjacent to the delivery nozzle (e.g., such as shown in FIG. 7), in some embodiments, the plug valve and seat do not need to be positioned adjacent to the delivery nozzle. FIG. 8 shows an alternate configuration in which the plug 801 and seat 802 may be moved upward, and the downstream portion of the stem may be shortened so that the downstream portion of the delivery channel 803 is clear. The flow path around the seat 802 may be shortened relative to the channel width to permit low impedance flow when the valve is open. This may reduce the complexity of the structure near the depositor apertures to permit smaller and/or more densely packed apertures. The configuration may increase switching time due to the additional channel volume downstream of the plug 801. Switching time may be on the order of 0.1 to 1 ms in this case of an upstream plug 801 and seat 802. Switching times for the plug 801 and seat 802 close coupled to the aperture may be up to 100× shorter. Factors like actuator speed or the duration of transients in the flow around the micronozzle may also change the switching times.

Figure 9:
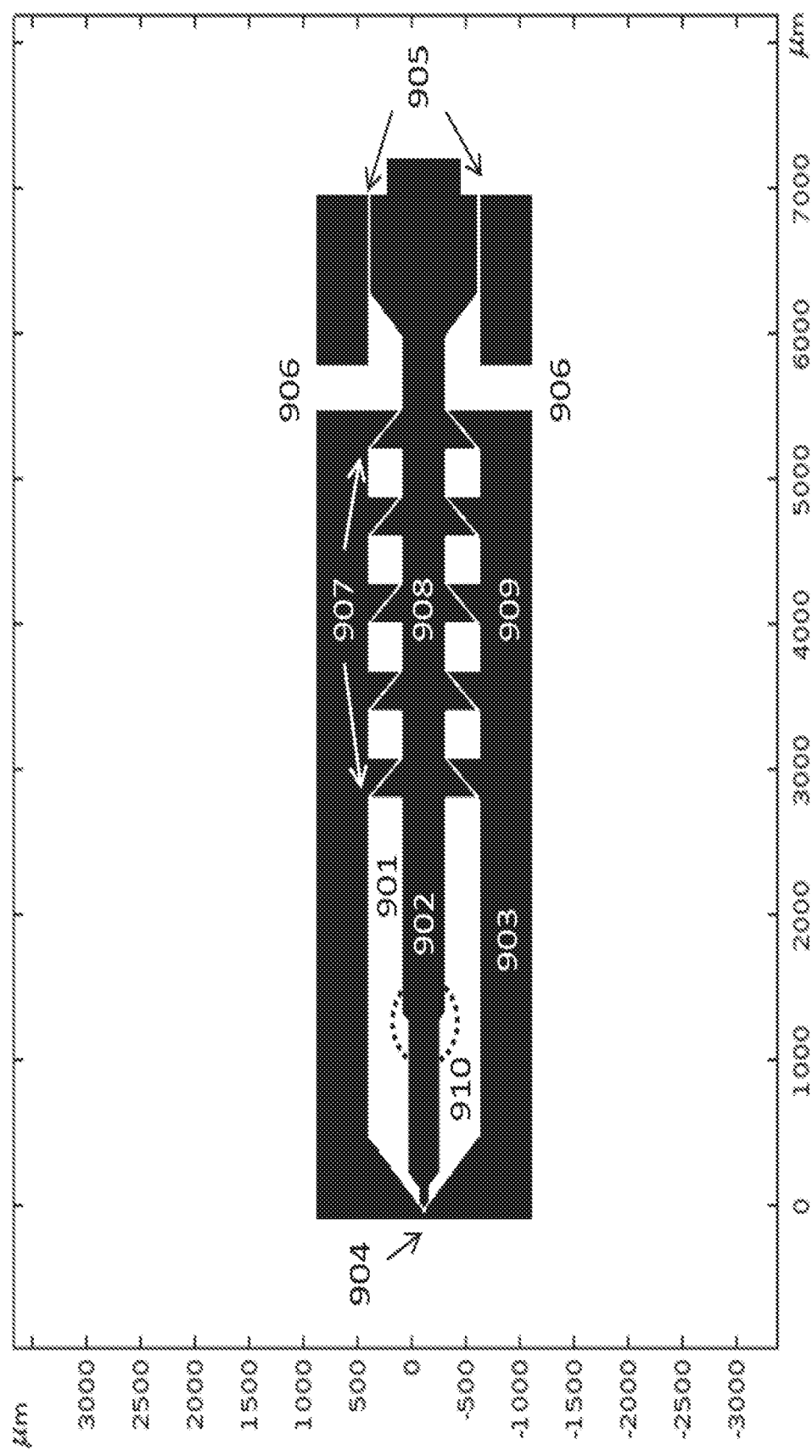
FIG. 9 shows a valve that balances flow between a delivery aperture in one position and an exhaust shunt in another position according to an embodiment of the disclosed subject matter.

FIG. 9 shows a valve that balances flow between a delivery aperture in one position and an exhaust shunt in another position according to an embodiment of the disclosed subject matter. A delivery gas flow of 6 sccm N2 was modeled using COMSOL Multiphysics. The simulated volume is shown in cross section in FIG. 9, where the gas filled 901 volume may be white, while the solid bodies of the stem 902 and channel wall 903 may be dark. The absolute pressure at the nozzle aperture 904 and the pushrod channel 905 may be 200 Torr. The absolute pressure at the downstream ends of the shunts to exhaust 906 may be 150 Torr. The valve controlling flow to the exhaust may contain five sets 907 of plugs 908 and seats 909. The delivery via 910 may be out of plane from the rest of the structures, so its position is indicated by a dashed circle. A plurality of sets of co-linear plugs 908 and seats 909 may provide balanced valve actuation when switching flow between the nozzle 904 and the exhaust 906, so that the delivery gas flow between the delivery via 910 and nozzle aperture 904 when the valve stem 902 is at equilibrium may be equal to the conductance between the delivery via 910 and exhaust shunt when it is depressed. Flow to the exhaust shunt may be minimal when the valve stem 902 is at its equilibrium position. Including additional plugs may reduce and/or eliminate the need for a mechanism to apply tension to the pushrod.

In the equilibrium position of the stem 902 of the valve in FIG. 9, 90% of the gas may flow through the nozzle aperture 904 and 10% of the gas may be captured by the exhaust 906. An additional 0.85 sccm may be drawn into the exhaust shunt along the path surrounding the pushrod 905. This flow may prevent fouling of the pushrod. The closed position may be modeled by depressing the pushrod 9 µm. This may leave a 1 µm gap between the valve and seat to account for tolerance issues that may create small flow paths between the abutting surfaces. 94% of the gas may be captured by the shunt, while 6% of the gas may leave through the nozzle aperture 904. If the valve is used in a DEC depositor application, the attenuated flow of delivery gas through the depositor nozzle may be captured by the exhaust, and printing may be effectively stopped.

Figure 10A:
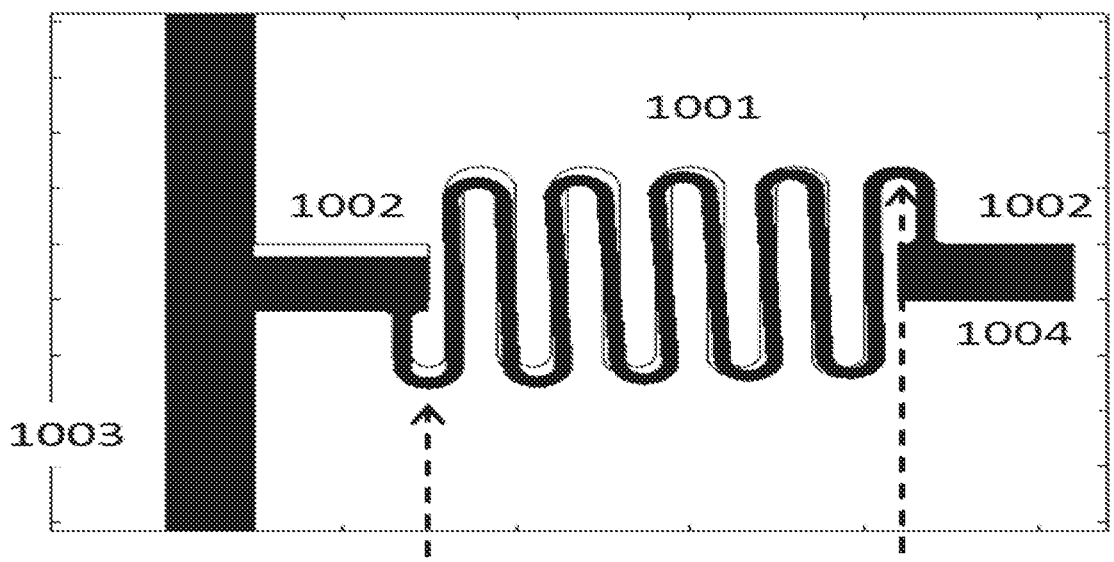
FIG. 10A shows a spring element to suspend a stem of a plug valve on a flexure according to an embodiment of the disclosed subject matter.

FIG. 10A shows a spring element to suspend a stem of a plug valve on a flexure according to an embodiment of the disclosed subject matter. An element of the flexure supporting the stem is shown in detail in FIG. 10A. The element of the flexure may include a convoluted spring element 1001 that extends between attachment tabs 1002 on the stem 1003 and channel wall 1004. The spring element 1001 may be 10 µm thick and etched from the same Si piece as the stem 1003 and channel. Stress may be reduced if the flexure stands parallel to the direction of motion at its attachment to the tab 1002. Stress may be greatest on the curved portions of the spring element 1001, and may be minimized by increasing the number of convolutions, their radius of curvature, or the lengths of the vertical members between curves, subject to the constraints of the channel geometry. In the modeled example, the stem may deflect downward by 14 µm to block a 10 micron channel between the plug and seat if the seat is tapered at 45°.

Figure 10B:
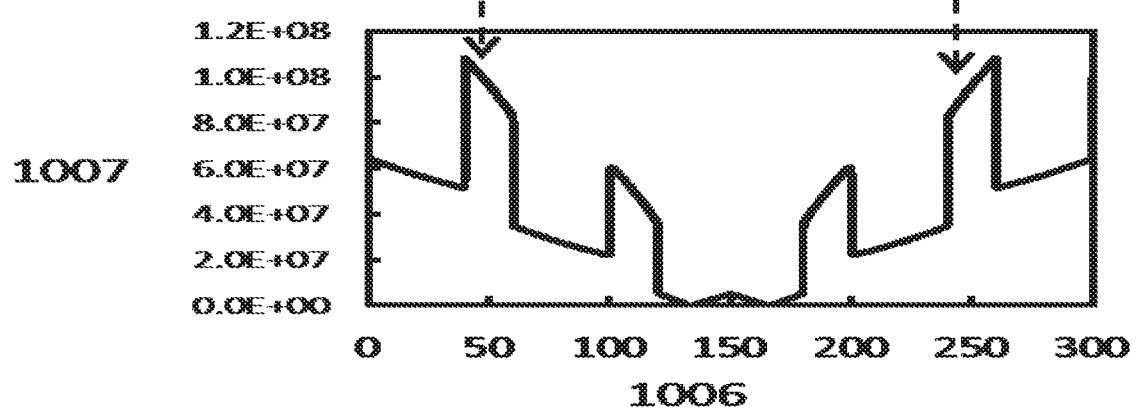
FIG. 10B shows stress generated on the spring element of FIG. 10A according to an embodiment of the disclosed subject matter.

FIG. 10B shows stress generated on the spring element of FIG. 10A according to an embodiment of the disclosed subject matter. The von Mises stress along the lower surface of the spring element 1001 may be plotted on the vertical axis 1005 in FIG. 10B. The horizontal axis 1006 may indicate position along the width of the spring element 1001, measured from the attachment tab 1002 in microns. Two vertical lines 1007 may indicate a correspondence between a point on the spring element 1001 and the plot point indicating the stress at those locations. The maximum stress generated may be approximately 100 MPa, below the fatigue endurance limit of 120 MPa for etched Si structures with a surface roughness of 10 nm (K. Petersen, "Silicon as a Mechanical Material," *Proceedings of the IEEE*, Vol. 70, No. 5, May 1982). The number and complexity of spring elements 1001 may not adversely affect manufacturability, as they are patterned with photolithography. The aspect ratio of the fabrication process may set a minimum thickness for the spring element 1001.

The valve assembly can be fabricated by a variation of the process used to make micronozzle arrays described in U.S. Pat. No. 9,178,184. The channel array and stem may be fabricated from a single Si wafer using a nested deep reactive ion etching (DRIE) process. FIGS. 11A-11D show operations in a fabrication process that may be used to produce a micronozzle array for DEC OVJP that incorporates integrated plug valves according to embodiments of the disclosed subject matter.

Figure 11B:
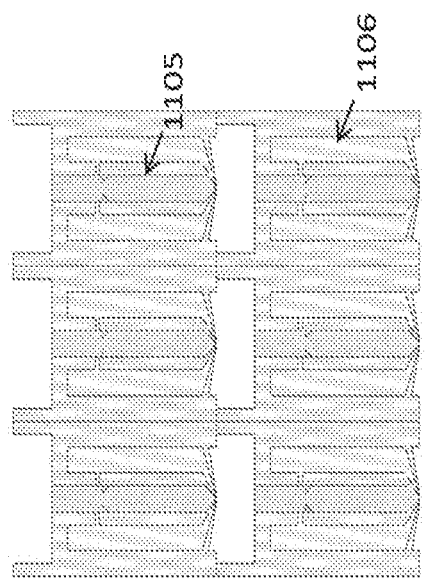
FIGS. 11A-11D show operations in a fabrication process that may be used to produce a micronozzle array for DEC OVJP that incorporates integrated plug valves according to embodiments of the disclosed subject matter.
Figure 11D:
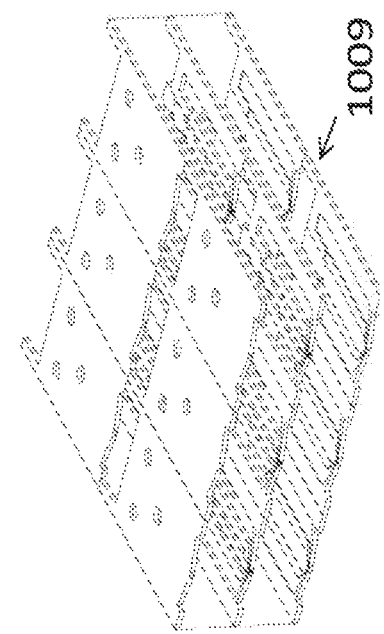
Figure 11A:
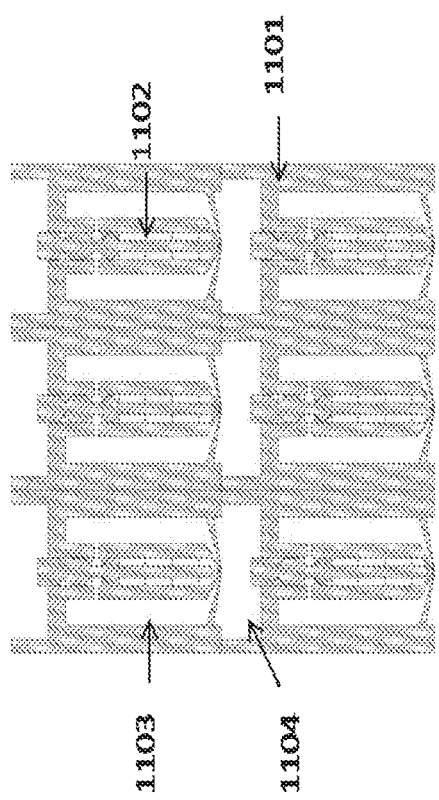
Figure 11C:
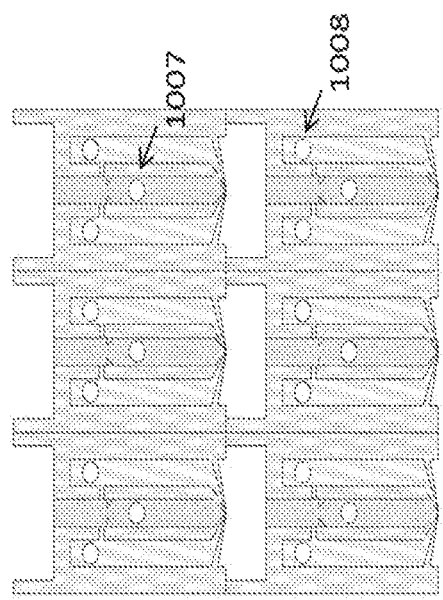

An example of the repeating pattern generated on the wafer after processing is shown in FIG. 11A. Two rows of arrayed depositors are shown. The unetched areas 1101 may define the stem, plug, pushrod, and the walls surrounding the microchannel and delivery aperture. The first and deeper portion of the nested etch may clear the regions of the channels around the spring elements 1102 to define the flexure elements. The second and shallower portion of the etch may remove material uniformly from the channels 1103. A vestibule 1104 may be etched through the wafer, and may surround the apertures of one row of depositors and the pushrods of the row of depositors beneath it. The vestibule 1104 ensures that delicate structures will be clear of dicing lines when the rows of the finished devices are separated into microarrays.

The wafer etched in a previous operation is then bonded between two additional wafers to seal its upper and lower surfaces. The lower wafer, shown in FIG. 11B, includes shallow etched pockets 1105 to provide clearance for motion of the stem. The lower wafer may also have etched regions aligning with the exhaust channels and apertures 1106 to increase their depth. The upper wafer, shown in FIG. 11C, may include etchings, as well as delivery 1107 and exhaust vias 1108 for fluid flow. The three wafers may be aligned and bonded into a stack as illustrated in the blown up view in FIG. 11D. The three wafer stack may be bonded at once or sequentially, so that that the third wafer is added to a bonded pair. Fusion bonding may be used to bond three Si wafers. Other combinations of fabrication substrates and bonding methods may be used. For example, the middle and one outer wafer may be Si, while the second outer wafer may be borosilicate glass. The Si wafers may be fusion bonded to each other, and the glass wafer is bonded to the pair using anodic bonding. Depositor assemblies alongside each other may be part of the same micronozzle array, while vertically separated rows represent different depositors. The rows of depositors forming arrays may be separated by dicing through the wafer stack along the members 1109 connecting the rows.

It is understood that the various embodiments described herein are by way of example only, and are not intended to limit the scope of the invention. For example, many of the materials and structures described herein may be substituted with other materials and structures without deviating from the spirit of the invention. The present invention as claimed may therefore include variations from the particular examples and preferred embodiments described herein, as will be apparent to one of skill in the art. It is understood that various theories as to why the invention works are not intended to be limiting.

We claim:
1. A device comprising:
  a micronozzle array formed from monolithic silicon and configured for use at 200-400° C. having a plurality of nozzles, each nozzle of the plurality of nozzles includ- ing an integrated plug valve that allows flow from the nozzle to be attenuated separately from each other nozzle of the plurality of nozzles, wherein each of the plurality of nozzles includes:
- a microchannel, formed from the monolithic silicon, having a first channel portion and a second channel portion, wherein the first channel portion is narrower than the second channel portion, wherein the first channel portion forms an aperture of the nozzle that is configured to eject vapor from the microchannel; and
- a stem, formed from the monolithic silicon that includes the integrated plug valve is suspended in the microchannel to attenuate the flow from the nozzle.

2. The device of claim 1, wherein the microchannel has a taper, and a plug of the integrated plug valve blocks the flow of the nozzle aperture when it abuts the taper.

3. The device of claim 2, wherein the taper is a valve seat of the integrated plug valve.

4. The device of claim 2, wherein the plug is connected to the stem is suspended by a plurality of spring elements formed from the monolithic silicon and connected to sidewalls of the second channel portion of the microchannel.

5. The device of claim 4, wherein the stem is formed with a push rod from the monolithic silicon, wherein the plug, stem, and push rod extend through the depth of the microchannel, and the push rod extends beyond an upper plane of the micronozzle array.

6. The device of claim 5, wherein the push rod is actuated by one from the group consisting of: a piezoelectric cell and a ceramic block, a camshaft, and a solenoid.

7. The device of claim 5, wherein the push rod is one of a plurality of push rods of the micronozzle array, where each push rod of the plurality of push rods actuates a valve of the microchannel array individually.

8. The device of claim 5, wherein the push rod is one of a plurality of push rods of the micronozzle array, where each push rod of the plurality of push rods are actuated by a single actuator.

9. The device of claim 5, wherein a flow path along the push rod is linked to exhaust flow to prevent organic vapor from leaking to an upper surface of the micronozzle array.

10. The device of claim 4, wherein the stem has a first section and a second section, wherein the first section is narrower than the second section downstream of a via, and the second section is wider than the first section upstream of the via.

11. The device of claim 2, further comprising:
- a first seat formed to a first sidewall of the microchannel from the monolithic silicon; and
- a second seat formed to a second sidewall of the microchannel from the monolithic silicon,
wherein the first seat and the second seat prevent downstream movement of the plug so that a delivery portion of the microchannel is clear.

12. The device of claim 1, further comprising:
a plurality of delivery apertures, wherein the microchannel is formed from the monolithic silicon so as to be connected to one of the plurality of delivery apertures of the micronozzle array, and other microchannels of the plurality of microchannels are formed from the monolithic silicon so as to be respectively connected to the other delivery apertures of the plurality of delivery apertures.

13. The device of claim 1, further comprising a first exhaust channel formed from the monolithic silicon and disposed adjacent to a first side of the microchannel, and a second exhaust channel formed from the monolithic silicon and disposed adjacent to a second side of the microchannel.

14. The device of claim 13, wherein the first exhaust channel includes a first exhaust via, and the second exhaust channel includes a second exhaust via.

15. The device of claim 13 further comprising:
- a first exhaust aperture disposed at a lower edge of the first exhaust channel; and
- a second exhaust aperture disposed at a lower edge of the second exhaust channel.

16. The device of claim 13, further comprising:
- a first shunt formed from the monolithic silicon and disposed between a delivery gas inlet channel of the microchannel and the first exhaust channel; and
- a second shunt formed from the monolithic silicon and disposed between a delivery gas inlet channel of the microchannel and the second exhaust channel.

17. The device of claim 1, wherein the second channel portion of the microchannel includes a via.

18. The device of claim 1, wherein the micronozzle array is held onto a print head by a pressure plate or is bonded directly to the print head.

* * * * *